United States Patent [19]

Subramanian

[11] Patent Number: 5,482,917
[45] Date of Patent: Jan. 9, 1996

[54] T1-M-CU-O-F SUPERCONDUCTORS

[75] Inventor: Munirpallam A. Subramanian, New Castle, Del.

[73] Assignee: E. I. du Pont de Nemours and Company, Wilmington, Del.

[21] Appl. No.: 124,908

[22] Filed: Sep. 21, 1993

[51] Int. Cl.[6] .......................... H01B 12/00; H01L 39/12
[52] U.S. Cl. .................. 505/123; 505/100; 505/120; 505/783; 252/518; 252/521
[58] Field of Search ............................ 505/100, 120, 505/123, 783; 252/518, 521

[56] References Cited

U.S. PATENT DOCUMENTS

| 4,929,594 | 5/1990 | Gopalakrishnan et al. | 505/1 |
| 5,106,830 | 4/1992 | Sheng et al. | 505/1 |

OTHER PUBLICATIONS

Chen et al., Solid State Communications, vol. 83, No. 11, pp. 895–898 (1992).
Ganguli et al., J. of Solid State Chem., vol. 91, pp. 397–402 (1991).
Subramanian, Mat. Res. Bull., vol. 25, pp. 191–197 (1990).
Ku et al., Jap. J. of Applied Physics, vol. 28, No. 6, pp. L923–L925 (Jun. 1989).
Ganguli et al., J. of Solid State Chem., vol. 93, pp. 250–255 (1991).

Primary Examiner—Paul Lieberman
Assistant Examiner—M. Kopec

[57] ABSTRACT

A superconducting composition having the nominal formula $TlM_2CuO_{5-x}F_x$ wherein M is Ba and x is from about 0.10 to about 0.65, or M is Sr and x is from about 0.35 to about 0.75 is disclosed.

8 Claims, 2 Drawing Sheets

T1-M-CU-O-F SUPERCONDUCTORS

FIELD OF THE INVENTION

This invention provides novel fluorine-substituted Tl—M—Cu oxide superconductors wherein M is Ba, Sr or a mixture thereof.

BACKGROUND OF THE INVENTION

While a number of superconducting compounds have been discovered in the Tl—Ca—Ba—Cu—O system, analogous superconducting compounds with Ba replaced by Sr cannot generally be synthesized as pure phases. Both single and double Tl—O layer structure materials have been synthesized in the Tl—Ca—Ba—Cu—O system but only single Tl—O layer structure materials have been synthesized in the Tl—Ca—Sr—Cu—O system and the structures of these phases have been stabilized by the introduction of substituents.

Z. Y. Chen et al., Solid State Commun. 83, 895 (1992) disclose that samples with nominal composition $TlSr_2CaCu_2O_{7-x}A_x$ wherein A is F and $x=0.0–1.5$ are nearly single-phase and were superconducting with transition temperatures of 35–50 K. For A is Cl and $x=0–0.5$ it was found that a small amount of Cl destroyed the superconductivity of the samples and prevented the formation of the 1212 phase.

The single Tl—O layer structure materials containing no calcium have the formula $TlSr_2CuO_5$ and $TlBa_2CuO_5$. A. K. Ganguli and M. A. Subramanian, J. Solid State Chem. 93, 250 (1991) disclose that $TlSr_2CuO_5$ is metallic and no superconductivity was observed down to 4.2 K. Thus Applicants are not merely adding fluorine to a known superconductor. It has been found that the addition of another element, such as La or Nd is required to render the Tl—Sr—Cu—O compositions superconducting. M. A. Subramanian, Mat. Res. Bull. 25, 191 (1990) discloses that the oxides with the formula $TlSr_{2-x}R_xCuO_5$ wherein R is La or Nd and $x=0.6$ to 1.0 are single-phase with tetragonal structure. These oxides are superconducting with transition temperatures in the range of 35–48 K. As for the barium-containing compositions H. C. Ku et al., Jpn. J. Appl. Phys. 28, L923 (1989) disclose that $TlBa_2CuO_5$ is metallic with a metastable superconducting transition occurring with an onset around 25 K and zero restivity at 10 K. Again, the presence of La or Nd is required in order to achieve a stable superconducting composition. The oxides with the formula $TlBa_{2-x}R_xCuO_5$ wherein R is La or Nd and $x=0.2$ to 0.6 have tetragonal structure and are superconducting with transition temperatures above 40 K.

The present invention provides novel superconductors of the Tl—M—Cu—O type without the presence of Ca, La, or Nd.

SUMMARY OF THE INVENTION

This invention comprises single-phase superconductors having the nominal formula $TlM_2CuO_{5-x}F_x$ wherein M is Ba, Sr or a mixture thereof and x is from about 0.10 to about 0.65 when M is Ba and x is from about 0.35 to about 0.75 when M is Sr. When M is a mixture of Ba and Sr the lower limit of x increases from about 0.10 to about 0.35 and the upper limit of x increases from about 0.65 to about 0.75 as the amount of Sr in M increases from 0 to 100%. These compositions exhibit an onset of superconductivity at a temperature of at least about 35 K.

This invention further comprises a method for conducting an electrical current within a conducting material without electrical resistive losses comprising cooling a conducting material comprising a composition having the nominal formula $TlM_2CuO_{5-x}F_x$ wherein M is Ba and x is from about 0.10 to about 0.65 or M is Sr and x is from about 0.35 to about 0.75 to a temperature below the $T_c$ of said composition, followed by initiating a flow of electrical current within said conducting material while maintaining it below said temperature.

DETAILED DESCRIPTION OF THE INVENTION

Figure 1:
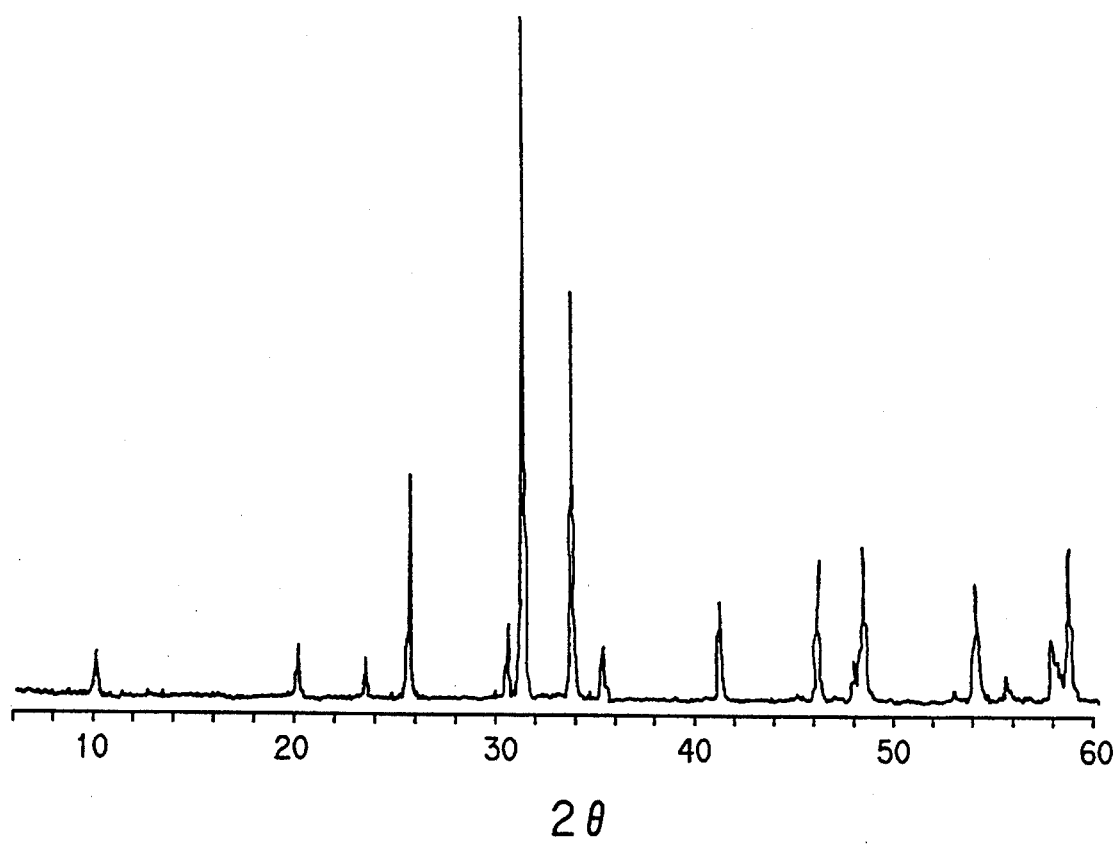
FIG. 1 shows the X-ray powder diffraction pattern for the composition $TlSr_2CuO_{4.5}F_{0.5}$ of Example 2.

The present invention comprises superconducting compositions having the nominal formula $TlM_2CuO_{5-x}F_x$ wherein M is Sr and x is from about 0.10 to about 0.65 or M is Ba and x is from about 0.35 to about 0.75. Preferred compositions include those wherein M is Sr and x is from about 0.40 to about 0.60, and those wherein M is Ba and x is from about 0.40 to about 0.50.

The superconducting compositions of this invention can be prepared by the following process. Quantities of the reactants $MO_2$, MO, TlF, $Tl_2O_3$ and CuO are chosen to provide an atomic ratio of Ti:M:Cu of 1:2::1 and to provide a ratio of F:Tl equal to x. Specific appropriate relative weights of the various reactants needed to form oxides with the nominal formula $TlM_2CuO_{5-x}F_x$ with various values of x are disclosed in the Examples. These reactants are ground thoroughly in an agate mortar. The mixed powder may be heated directly or it can be formed into a pellet or other shaped object and then heated. The powder or pellets are sealed in tubes of non-reactive metal such as gold prior to heating. The tubes are heated to a temperature of about 800° C. at a rate of about 5° C. per minute with at least about 0.5 Kbar (50 MPa) of external pressure. Preferably, the pressure is about 3 Kbar (3 MPa). The tubes containing the reactants are maintained under these conditions for at least about 1 hour. The tube is then cooled to room temperature followed by reducing the pressure to atmospheric pressure. The tube can then be cut open and the samples recovered. Heating the reactants in a sealed container is necessary to prevent the loss of the volatile thallium as well as oxygen and fluorine. Pressures in excess of atmospheric are necessary to produce the fluorine-substituted $TlM_2CuO_{5-x}F_x$ oxides.

The $TlM_2CuO_{5-x}F_x$ product can be ground to form a powder by conventional means known to those skilled in the art and the powder used to obtain an X-ray diffraction powder pattern. The lattice parameters of the superconductors of the present invention have been determined from such X-ray diffraction powder pattern results indexed on a tetragonal unit cell with lattice parameter a of about 0.38 nm and lattice parameter c of about 0.90 nm when M is Sr, and lattic parameter a of about 0.38 nm and lattice parameter c of about 0.96 when M is Ba. The lattice parameters increase with increasing fluorine content. The X-ray diffraction patterns indicate that these superconductors are essentially single-phase.

Superconductivity can be confirmed by resistivity measurements using the well-known four-probe technique or by observing magnetic flux exclusion, i.e., the Meissner effect. This effect can be measured by the method described in an article by E. Polturak and B. Fisher in Physical Review B, 36, 5586(1987), herein incorporated by reference. The superconducting compositions of the present invention exhibit an onset of superconductivity at a temperature of at least 35 K. The temperature at which the resistivity versus temperature curve begins to fall to zero or at which the flux exclusion begins to occur is the onset of superconductivity and will be referred to hereinafter as $T_c$.

The present invention further comprises a method for conducting an electrical current within a conducting material without electrical resistive losses comprising cooling a conducting material comprising a composition having the nominal formula $TlM_2CuO_{5-x}F_x$ wherein M is Ba and x is from about 0.10 to about 0.65 or M is Sr and x is from about 0.35 to about 0.75 to a temperature below the $T_c$ of said composition, followed by initiating a flow of electrical current within said conducting material while maintaining it below said temperature. Preferred compositions for use herein are those wherein M is Ba and x is from about 0.40 to about 0.50, or wherein M is Sr and x is from about 0.40 to about 0.60. Cooling can be achieved to a temperature below the superconducting transition temperature Tc, by exposing the material to liquid nitrogen or to liquid helium in a manner well known to those in this field. Preferably, the conducting material is in the form of a wire or a bar. A flow of electrical current is then initiated using methods known to those skilled in the art, e.g., using an electromotive force or magnetic field induction. Such flow is obtained without any electrical resistive losses. To provide exceptionally high magnetic fields with minimal power losses, the wire mentioned previously could be wound to form a coil or solenoid which would be exposed to liquid helium or liquid nitrogen before inducing any current into the coil. Such fields can also be used to levitate objects as large as railroad cars.

The superconducting compositions and method of the present invention can be used to conduct current extremely efficiently or to provide a magnetic field for magnetic imaging for medical purposes or for particle accelerators. These superconducting compositions are also useful in Josephson devices such as SQUIDS (superconducting quantum interference devices) and in instruments that are based on the Josephson effect such as high speed sampling circuits and voltage standards.

EXAMPLES OF THE INVENTION

EXAMPLES 1–4

COMPARATIVE EXPERIMENTS A–D

Compositions corresponding to x=0.2, 0.3, 0.4, 0.5, 0.6, 0.7, 0.8 and 1.0 in the nominal formula $TlSr_2CuO_{5-x}F_x$ were prepared by grinding in an agate mortar for about 30 minutes the quantities of $SrO_2$, TlF, $Tl_2O_3$ and CuO shown: in Table I for each Example 1–4 and Comparative Experiments A–D.

TABLE I

| Example/ Comparative Experiment | x | $SrO_2$ g | TlF g | $Tl_2O_3$ g | CuO g |
| --- | --- | --- | --- | --- | --- |
| A | 0.20 | 2.3924 | 0.4468 | 1.8270 | 0.7954 |
| B | 0.30 | 2.3924 | 0.6701 | 1.5986 | 0.7954 |

TABLE I-continued

| Example/ Comparative Experiment | x | $SrO_2$ g | TlF g | $Tl_2O_3$ g | CuO g |
| --- | --- | --- | --- | --- | --- |
| 1 | 0.40 | 2.3924 | 0.8935 | 1.3702 | 0.7954 |
| 2 | 0.50 | 2.3924 | 1.1169 | 1.1419 | 0.7954 |
| 3 | 0.60 | 2.3924 | 1.3403 | 0.9135 | 0.7954 |
| 4 | 0.70 | 2.3924 | 1.5637 | 0.6851 | 0.7954 |
| C | 0.80 | 2.3924 | 1.7870 | 0.4567 | 0.7954 |
| D | 1.00 | 2.3924 | 2.2338 | — | 0.7954 |

For each composition, these powders were pressed into pellets 10 mm in diameter and about 3 mm thick. Two pellets of a given composition were placed in a gold tube which was sealed by welding. The gold tube containing the pellets was then placed in an oven and heated at a rate of 5° C. per minute to 800° C. under a pressure of 3 kbar (3×10⁸ Pa) and maintained under these conditions for 3 hours. The furnace was then turned off and the tube allowed to cool to room temperature. The tube was then cut open and the pellets recovered. One of the pellets of each composition was crushed to form a powder and used to obtain an X-ray powder diffraction pattern. These patterns were indexed on the basis of a tetragonal unit cell. The X-ray powder diffraction patterns for the superconducting compositions indicated that these compositions were essentially single phase. The lattice parameters a and c determined from the X-ray powder diffraction patterns are shown in Table III. The X-ray powder diffraction pattern obtained for the composition $TlSr_2CuO_{4.5}F_{0.5}$ of Example 2 is shown in FIG. 1 and observed and calulated d-spacings, the relative intensities and the indices of the observed reflections are shown in Table II.

Figure 2:
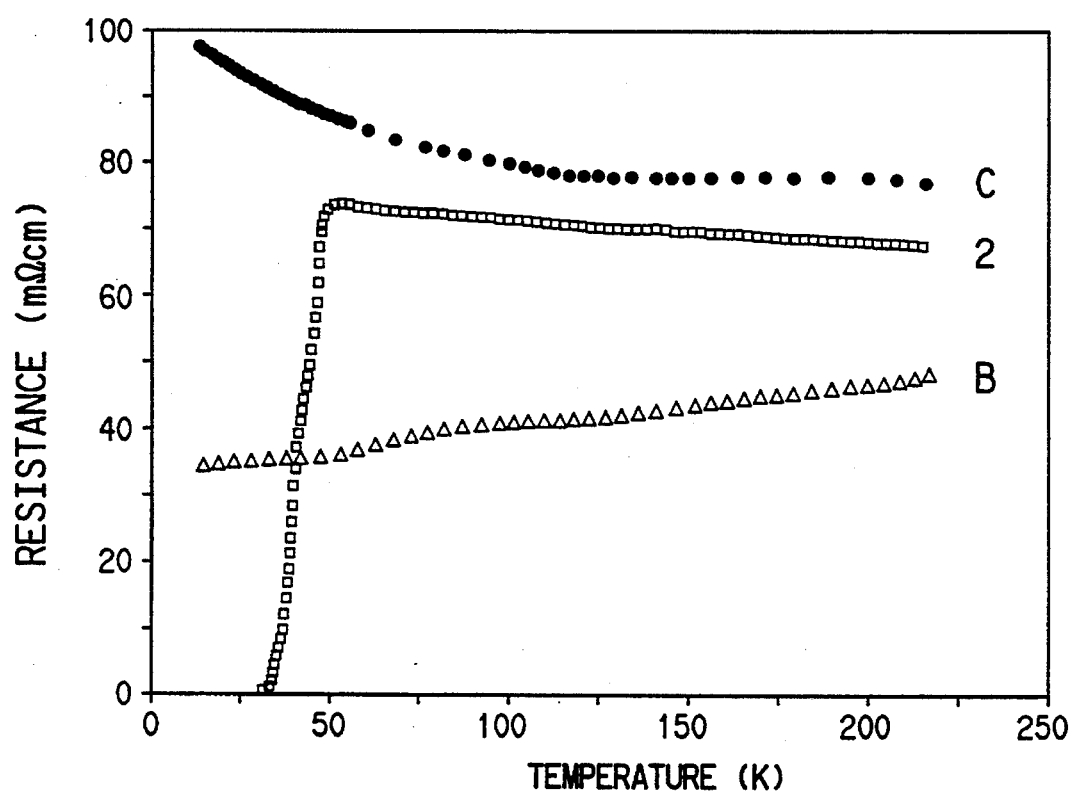
FIG. 2 shows the resistance as a function of temperature for the composition of Example 2 and comparative compositions B and C.

Powders of each composition were pressed into bars 2 mm×2 mm×4 mm using a pressure of about 10,000 psi (7×10⁷ Pa). Resistance measurements were made using the 4-probe technique with a current of 10 µa. Plots of the resistance versus temperature are shown in FIG. 2 for the compositions of Example 2 and Comparative Experiments B and C. The compositions of Comparative Experiments A and B were found to be metallic, that of Comparative Experiments C and D were semiconducting. The onset of conductivity $T_c$ for compositions of Examples 1–4 are also shown in Table III. Magnetic flux exclusion measurements confirmed the superconductivity of Examples 1–4.

TABLE II

| $d_{obs}$ (nm) | $d_{calc}$ (nm) | Intensity | hkl |
| --- | --- | --- | --- |
| 0.8979 | 0.8993 | 7 | 001 |
| 0.4494 | 0.4497 | 8 | 002 |
| 0.3791 | 0.3792 | 6 | 100 |
| 0.3494 | 0.3494 | 30 | 101 |
| 0.2996 | 0.2998 | 10 | 003 |
| 0.2901 | 0.2899 | 100 | 102 |
| 0.2681 | 0.2681 | 57 | 110 |
| 0.2571 | 0.2570 | 7 | 111 |
| 0.2247 | 0.2248 | 16 | 004 |
| 0.1999 | 0.1999 | 20 | 113 |
| 0.1935 | 0.1934 | 6 | 104 |
| 0.1898 | 0.1896 | 21 | 200 |
| 0.1723 | 0.1723 | 17 | 114 |
| 0.1667 | 0.1667 | 4 | 211 |
| 0.1625 | 0.1625 | 9 | 105 |
| 0.1603 | 0.1602 | 5 | 203 |
| 0.1588 | 0.1587 | 23 | 212 |

TABLE III

| Example/Comparative Experiment | x | a (nm) | c (nm) | $T_c$ (K) |
|---|---|---|---|---|
| A | 0.20 | — | — | Metallic |
| B | 0.30 | 0.3785 | 0.8975 | Metallic |
| 1 | 0.40 | 0.3788 | 0.8984 | 45 |
| 2 | 0.50 | 0.3792 | 0.8993 | 52 |
| 3 | 0.60 | 0.3794 | 0.9003 | 48 |
| 4 | 0.70 | 0.3798 | 0.9013 | 38 |
| C | 0.80 | 0.3801 | 0.9018 | Semiconducting |
| D | 1.00 | — | — | Semiconducting |

EXAMPLES 5-9

COMPARATIVE EXPERIMENTS E-H

Compositions corresponding to x=0.1, 0.2, 0.3, 0.4, 0.5, 0.6, 0.7., 0.8 and 1.0 in the nominal formula $TlBa_2CuO_{5-x}F_x$ were prepared by grinding in an agate mortar for about 30 minutes the quantities of $BaO_2$, BaO, TlF, $Tl_2O_3$ and CuO shown in Table IV for each Example 5-8 and Comparative Experiments E-H.

TABLE IV

| Example/Comparative Experiment | x | $BaO_2$ g | BaO g | TlF g | $Tl_2O_3$ g | CuO g |
|---|---|---|---|---|---|---|
| 5 | 0.10 | 1.6394 | 1.5334 | 0.2234 | 2.0553 | 0.7954 |
| 6 | 0.20 | 1.6394 | 1.5334 | 0.4468 | 1.8270 | 0.7954 |
| 7 | 0.30 | 1.6394 | 1.5334 | 0.6701 | 1.5986 | 0.7954 |
| 8 | 0.40 | 1.6394 | 1.5334 | 0.8935 | 1.3702 | 0.7954 |
| 9 | 0.50 | 1.6394 | 1.5334 | 1.1169 | 1.1419 | 0.7954 |
| E | 0.60 | 1.6394 | 1.5334 | 1.3403 | 0.9135 | 0.7954 |
| F | 0.70 | 1.6394 | 1.5334 | 1.5637 | 0.6851 | 0.7954 |
| G | 0.80 | 1.6394 | 1.5334 | 1.7870 | 0.4567 | 0.7954 |
| H | 1.00 | 1.6394 | 1.5334 | 2.2338 | — | 0.7954 |

For each composition, these powders were pressed into pellets 10 mm in diameter and about 3 mm thick. Two pellets of a given composition were placed in a gold tube which was sealed by welding. The gold tube containing the pellets was then placed in an oven and heated at a rate of 5° C. per minute to 800° C. under a pressure of 3 kbar ($3 \times 10^8$ Pa) and maintained under these conditions for 3 hours. The furnace was then turned off and the tube allowed to cool to room temperature. The tube was then cut open and the pellets recovered. One of the pellets of each composition was crushed to form a powder and used to obtain an X-ray powder diffraction pattern. These patterns were indexed on the basis of a tetragonal unit cell. The X-ray powder diffraction patterns for the superconducting compositions indicated that these compositions are essentially single phase for Examples 5-8. The X-ray powder diffraction pattern for Example 9 contained weak impurity lines. The lattice parameters a and c determined from these X-ray powder diffraction patterns are shown in Table V, The compositions of Comparative Experiments F-H were impure phases and showed no evidence of superconductivity. Powders of each composition were pressed into bars 2 mm×2 mm×4 mm using a pressure of about 10,000 psi ($7 \times 10^7$ Pa). Resistance measurements were made using the 4-probe technique with a current of 10 μ. The onset of conductivity $T_c$ for compositions of Examples 5-9 are also shown in Table V. The composition of Experiment E was a weakly superconducting, impure phase. Magnetic flux exclusion measurements confirmed the superconductivity of Examples 5-9.

TABLE V

| Example/Comparative Experiment | x | a (nm) | c (nm) | $T_c$ (K) |
|---|---|---|---|---|
| 5 | 0.10 | 0.3832 | 0.9585 | 35 |
| 6 | 0.20 | 0.3836 | 0.9590 | 48 |
| 7 | 0.30 | 0.3838 | 0.9598 | 45 |
| 8 | 0.40 | 0.3840 | 0.9602 | 75 |
| 9 | 0.50 | 0.3841 | 0.9605 | 65 |
| E | 0.60 | 0.3840 | 0.9606 | 50 |
| F | 0.70 | Impure Phase | | |
| G | 0.80 | Impure Phase | | |
| H | 1.00 | Impure Phase | | |

What is claimed is:

1. A superconducting composition having the nominal formula $TlM_2CuO_{5-x}F_x$ wherein M is Ba, Sr or a mixture thereof, x is from about 0.10 to about 0.65 when M is Ba, x is from about 0.35 to about 0.75 when M is Sr, and when M is a mixture of Ba and Sr, the lower limit of x increases from about 0.10 to about 0.35 and the upper limit of x increases from about 0.65 to about 0.75 as the amount of Sr in M increases from 0 to 100%.

2. The superconducting composition of claim 1 having a superconducting transition temperature of at least about 35K.

3. The superconducting composition of claim 1 being single phase.

4. The superconducting composition of claim 1 wherein M is Ba and x is from about 0.40 to about 0.50.

5. The superconducting composition of claim 1 wherein M is Sr and x is from about 0.40 to about 0.60.

6. A method for conducting an electrical current within a conducting material without electrical losses comprising cooling a conducting material comprising a composition having the nominal formula $TlM_2CuO_{5-x}F_x$ wherein M is Ba and x is from about 0.10 to about 0.65 or M is Sr and x is from about 0.35 to about 0.75 to a temperature below the $T_c$ of said composition, followed by initiating a flow of electrical current within said conducting material while maintaining said conducting material below said temperature.

7. The method of claim 6 wherein M is Ba and x is from about 0.40 to about 0.50.

8. The method of claim 6 wherein M is Sr and x is from about 0.40 to about 0.60.

* * * * *